(12) United States Patent
Nentwig et al.

(10) Patent No.: US 9,344,130 B2
(45) Date of Patent: May 17, 2016

(54) LEAKAGE CALIBRATION FOR A FREQUENCY CONVERTER

(71) Applicant: Broadcom Corporation, Irvine, CA (US)

(72) Inventors: Markus Rudiger Nentwig, Helsinki (FI); Jouni Kristian Kaukovuori, Vantaa (FI)

(73) Assignee: BROADCOM CORPORATION, Irvine, CA (US)

( * ) Notice: Subject to any disclaimer, the term of this patent is extended or adjusted under 35 U.S.C. 154(b) by 36 days.

(21) Appl. No.: 14/102,745

(22) Filed: Dec. 11, 2013

(65) Prior Publication Data

US 2014/0171008 A1 Jun. 19, 2014

(51) Int. Cl.
*H04B 17/00* (2015.01)
*H04B 1/10* (2006.01)
*H04B 15/06* (2006.01)
*H04B 1/30* (2006.01)
*H03D 3/00* (2006.01)
*H03D 7/14* (2006.01)

(52) U.S. Cl.
CPC ............. *H04B 1/30* (2013.01); *H03D 3/008* (2013.01); *H03D 7/1441* (2013.01); *H03D 7/1458* (2013.01); *H03D 7/1466* (2013.01); *H03D 2200/009* (2013.01)

(58) Field of Classification Search
CPC ............ H04B 1/10; H04B 1/30; H04B 15/06; H04B 17/21

USPC ........... 455/226.1, 226.2, 296, 302, 303, 310, 455/317, 323, 324
See application file for complete search history.

(56) References Cited

U.S. PATENT DOCUMENTS

| | | | |
|---|---|---|---|
| 2002/0197975 A1* | 12/2002 | Chen | H04B 1/30 455/324 |
| 2006/0240779 A1* | 10/2006 | Rostami | H04B 1/30 455/63.1 |
| 2007/0066269 A1 | 3/2007 | Kivekas et al. | |
| 2007/0099570 A1* | 5/2007 | Gao | H04B 1/30 455/63.1 |
| 2008/0238538 A1 | 10/2008 | Chiu | |
| 2009/0318095 A1 | 12/2009 | Shu | |
| 2010/0184397 A1* | 7/2010 | Kadous | H03G 3/3068 455/234.1 |
| 2012/0264391 A1* | 10/2012 | Basaran | H03D 7/1441 455/341 |

* cited by examiner

*Primary Examiner* — Nguyen Vo
(74) *Attorney, Agent, or Firm* — Oblon, McClelland, Maier & Neustadt, L.L.P.

(57) ABSTRACT

Techniques are described for calibration of a frequency converter for reducing a leakage-based direct current component at an output of the frequency converter. In an apparatus comprising a frequency converter arranged to perform frequency conversion on an input signal, a variable load arranged to act on at least one of an input and an output of the frequency converter, and a detector arranged to detect a direct current component of an output signal of the frequency converter, a plurality of states of the variable load are sequentially set, a variation between the direct current components for each one of the plurality of states of the variable load is observed, and at least one parameter influencing the direct current component of the output signal of the frequency converter is adjusted such that the observed variation is reduced.

20 Claims, 15 Drawing Sheets

LEAKAGE CALIBRATION FOR A FREQUENCY CONVERTER

TECHNICAL FIELD

The present disclosure relates to leakage calibration for a frequency converter. In particular, but not exclusively, the present disclosure relates to measures (including methods, apparatuses and computer program products) for calibration of a frequency converter for reducing a leakage-based direct current component at an output of the frequency converter.

BACKGROUND

In receivers of communication terminal equipment, such as radio receivers for cellular handsets, a frequency conversion is performed to convert a radio frequency (RF) signal into a baseband (BB) or intermediate frequency (IF) signal. Such frequency conversion is typically accomplished by mixing an input signal, which is input from a signal source, with a local oscillator (LO) signal. This basic principle is applied in different types of receiver architectures such as e.g. direct conversion and mixer-first (LNA-less) receiver architectures.

FIG. 1 shows, a schematic diagram of an exemplary topology of a direct-conversion receiver architecture.

As is evident from FIG. 1, a received radio signal is preselected by a pre-select (band-pass) filter, and the thus preselected radio) signal is amplified in a low-noise amplifier (LNA) before being down-converted. The down-conversion may be performed with two down-conversion mixers (MIX) controlled by a local oscillator (LO) signal, which is divided into an in-phase LO signal and a quadrature LO signal with 90° phase shift to prevent signal sidebands from aliasing on one another. In each receive path, prior to analog-to-digital conversion by an analog-to-digital converter (ADC), the signal is low-pass filtered by a low-pass filter (LP) and amplified by an amplifier (AMP) such that the signal level for the ADC, is at a sufficient level.

FIG. 2 shows a schematic diagram of an exemplary topology of a mixer-first (LNA-less) receiver architecture.

As is evident from FIG. 2, there is no active amplifier, such as the LNA in FIG. 1, between a pre-select (band-pass) filer and a further processing of the thus preselected radio signal. Otherwise, the topology of FIG. 2 corresponds to that of FIG. 1, and the processing in each receive path is basically similar to that described above in connection with FIG. 1.

In both receiver architectures described above, there is a problem in that the LO signal could leak through the mixers (which could be assigned to a frequency converter), i.e. that LO leakage signal components could appear at the input. If so, corresponding LO leakage signal components would result in DC components it an output signal of the frequency converter, which are not based on static DC offsets or second-order linearity (IIP2) effects but on self-mixing effects. These can however not be distinguished from DC components caused by other effects, such as temperature-dependent static DC offset or even-order nonlinearity effects, for example.

While this problem is also present in a direct-conversion receiver architecture, it is even more relevant in a mixer-first (LNA-less) receiver architecture. This is due to the lack of an amplifier such as a LNA at the receiver input, which leads to the lack of reverse isolation for LO leakage towards the antenna, and also the lack of an active amplification stage to increase the level of the wanted signal at the mixer.

One specific problem caused by LO leakage to a receiver input is that the LO signal contains phase noise that appears as additive noise at the receiver input and deteriorates the noise figure of the receiver. FIG. 3 shows a graph illustrating a receiver noise figure over LO leakage in a mixer-first (LNA-less) receiver architecture.

As is evident from FIG. 3, the deterioration of a receiver noise figure from leaked LO phase noise becomes worse with decreasing receiver bandwidth. For the LTE bandwidth modes 1.4, 3, 5, 10, 15 and 20 MHz, the receiver noise figure at every LO leakage is larger in this sequence. For example, the curve for the LIE 5 MHz mode, i.e. the third curve from the top, shows that LO leakage of −68 dBm at the input of a RFIC, which has a noise figure of 2.5 dB in the absence of LO leakage, will increase that noise figure to 5 dB.

According, narrow-band modes appear to be more sensitive to LO leakage (or phase noise), as most of the phase noise spectrum is confined in a bandwidth even smaller than 1.4 MHz. In other words, the absolute phase noise contributed to the LTE 1.4 MHz mode is essentially the same as for the LTE 20 MHz mode, regardless of the difference in receiver bandwidth, but the relative phase noise becomes larger width decreasing receiver bandwidth.

While calibration of a frequency converter (or its mixers) could reduce LO leakage and thus the resulting DC components, a receiver cannot directly sense is own LO leakage, as it converts to 0 Hz at baseband and appears in combination with DC offsets from other sources. Therefore, no such accurate calibration is feasible, but only "symptoms" of the LO leakage, i.e. resulting effects, can be observed, and a calibration can be based on adding the observed "symptoms" with opposite sign, resulting in an inaccurate calibration.

Accordingly, technique of leakage calibration for a frequency converter are required for reducing a leakage-based direct current component at an output of the frequency converter.

SUMMARY

Various embodiments of the present disclosure aim at addressing at least part of the above issues and/or problem and drawbacks. Various aspects of embodiments of the present disclosure are set out in the appended claims.

According to first embodiments, there is apparatus for use at a radio receiver, the apparatus comprising:

a frequency converter arranged to perform frequency conversion on an input signal;

a variable load arranged to act on at least one of an input and an output of the frequency converter;

a detector arranged to detect a direct current component of an output signal of the frequency converter, and a controller arranged to:
  sequentially set a plurality of states of the variable load;
  observe a variation between the direct current components detected by the detector for each one of the plurality of states of the variable load; and
  adjust at least one parameter influencing the direct current component of the output signal of the frequency converter such that the observed variation is reduced.

The apparatus according to the aforementioned embodiments of the present disclosure may comprise at least one processor and at least one memory, which may represent a processing system with corresponding functionality as explained herein. Such processing system may for example comprise at least one processor and at least one memory including computer program code (and, optionally, at least one transceiver or interface configured for communication with at least another apparatus), wherein the at least one processor, with the at least one memory and the computer program code, is arranged/configured to cause the apparatus to perform as described herein.

According to second embodiments, there is a method for controlling an apparatus comprising a frequency converter arranged to perform frequency conversion on an input signal a variable load arranged to act on at least one of an input and an output of the frequency converter, and a detector arranged to detect a direct current component of an output signal of the frequency converter, the method comprising:

sequentially setting a plurality of states of the variable load;

observing a variation between the direct current components detected by the detector for each one of the plurality of states of the variable load; and adjusting at least one parameter influencing the direct current component of the output signal of the frequency converter such that the observed variation is reduced.

According to embodiments, there is apparatus for use at a radio receiver, the apparatus comprising:

frequency conversion means for performing frequency conversion on an input signal;

variable load means for acting on at least one of an input and an output of the frequency converter;

detecting means for detecting a direct current component of an output signal of the frequency converter;

means for sequentially setting a plurality of states of the variable load;

means for observing a variation between the direct current components detected by the detector for each one of the plurality of states of the variable load; and means for adjusting at least one parameter influencing the direct current component of the output signal of the frequency converter such that the observed variation is reduced.

According to embodiments there is a computer program product comprising a non-transitory computer-readable storage median having computer readable instructions stored thereon, the computer readable instructions being executable by a computerized device to came the computerized device to perform a method according to the second embodiments.

According to embodiments, them is a computer program product comprising computer-executable computer program code which, when executed on a computerised device, is configured to came the computerised device to carry out a method according to the aforementioned method-related embodiment of the present disclosure.

Such computer program product may for example comprise or be embodied as a (tangible) computer-readable (storage) medium or the like on which the computer-executable computer program code is stored, and/or the program may be directly loadable into an internal memory of the computer or a processor thereof.

According to embodiments, there is provided a method substantially in accordance with any of the examples as described herein with reference to and illustrated by the accompanying drawings.

According to embodiments, there is provided apparatus substantially in accordance with any of the examples as described herein with reference to and illustrated by the accompanying drawings.

Further developments or modifications of the aforementioned example embodiments of the present disclosure are set out in the following.

By virtue of any one of the aforementioned example aspects of the present disclosure, there is provided a technique for calibration of a frequency converter for reducing a leakage-based direct current component at an output of the frequency converter.

Thus, by way of embodiments of the present disclosure, enhancements and/or improvements are achieved in terms of leakage calibration for a frequency converter.

Further features of embodiments will become apparent from the following description of preferred embodiments, give by way of example only, which is made with reference to the accompanying drawings.

DETAILED DESCRIPTION

Example aspects of the present disclosure will be described herein below. More specifically, example aspects of the present are described hereinafter with reference to particular non-limiting examples. A person skilled in the art will appreciate that embodiments are by no means limited to these examples, and may be more broadly applied.

It is to be noted that the following description of the present disclosure and its embodiments mainly refers to explanations being used as non-limiting examples for exemplifying purposes. As such, the description of embodiments given herein specifically refers to terminology which is related thereto.

Such terminology is only used it the context of the presented non-limiting examples, and does naturally not limit embodiments in any way.

In particular, the present disclosure and its embodiments may be applicable to any (kind of) radio receiver operable in any (kind of) application areas. Such application areas may for example involve any radio systems, radio communication systems as well as radar and satellite systems. For example, the present disclosure and its embodiments may be applicable to operate with 3GPP cellular systems, as well as other radio systems, such as positioning systems (e.g. GPS, GLONASS, Galileo, etc.), connectivity radio systems, such as WLAN and/or Bluetooth, measurement systems, theft alarm systems, or the like.

Hereinafter, various embodiments and implementations of the present disclosure and its aspects or embodiments are described using several alternatives. It is generally noted that according to certain needs and constraints, all of the described alternatives may be provided alone or in any conceivable combination (also including combinations of individual features of the various alternatives).

According to embodiments of the present disclosure, in general terms, there are provided measures of a technique for calibration of a frequency converter for reducing a leakage-based direct current component at an output of the frequency converter.

Figure 4:
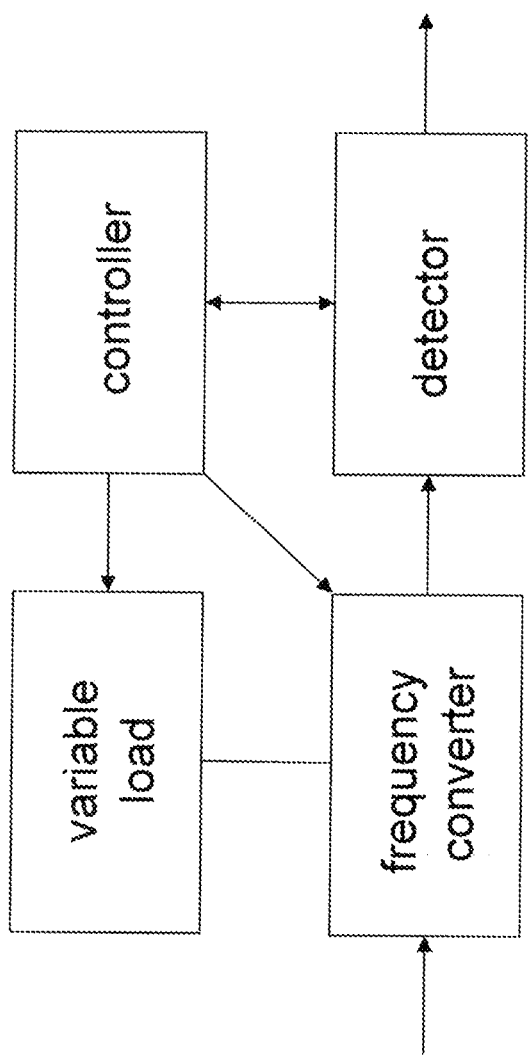
FIG. 4 shows a schematic block diagram illustrating an apparatus according to embodiments of the present disclosure.

FIG. 4 shows a schematic block diagram illustrating an apparatus according to embodiments of the present disclosure.

As shown in FIG. 4, an apparatus according to embodiments of the present disclosure comprises a frequency converter arranged to perform frequency conversion on an input signal (coming from a signal source, which could e.g. comprise an antenna, a duplexer, a RF fiber, a balun, or the like), a variable load arrange to act on at least one of an input and an output of the frequency converter, a detector arranged to detect a direct current (DC) component of an output signal of the frequency converter, and a controller arranged to control the frequency converter, the variable load and the detector and to obtain the detected direct current (DC) components from the detector.

As explained below, the controller is arranged to calibrate the frequency converter. In such calibration, the controller is arranged to set sequentially a plurality of states of the variable load (i.e. a variable input load and/or a variable output load), to observe a variation between the direct current (DC) components detected by the detector for each one of the plurality of states of the variable load, and to adjust at least one parameter influencing the direct current (DC) component of the output signal of the frequency converter such that the observed variation is reduced.

Figure 1:
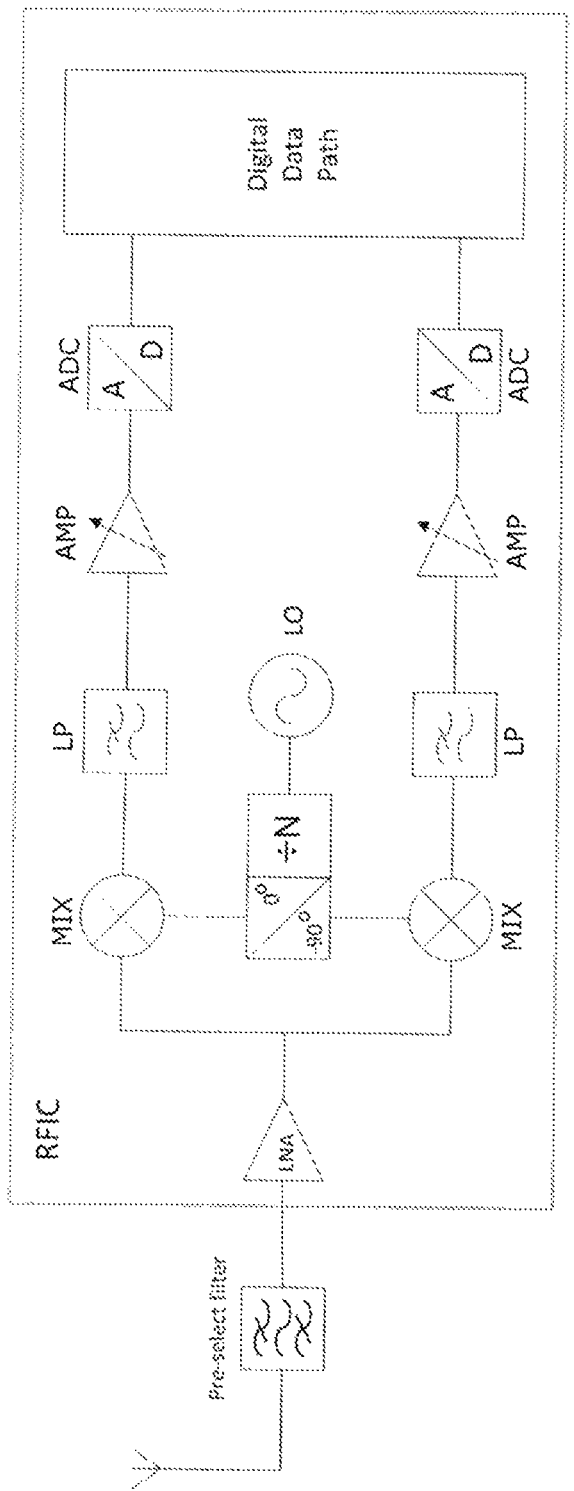
FIG. 1 shows a schematic diagram of an example topology of a direct-conversion receiver architecture, for which embodiments of the present disclosure are applicable.
Figure 2:
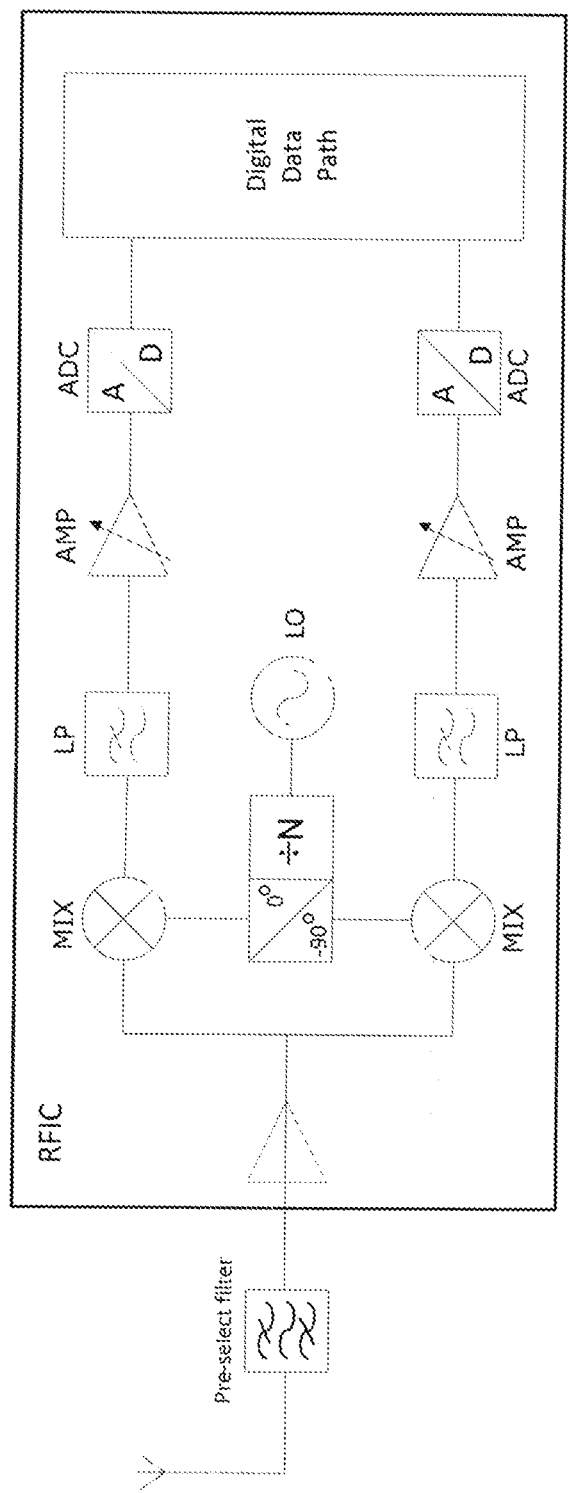
FIG. 2 shows a schematic diagram of an example topology of a mixer-first receiver architecture, for which embodiments of the present disclosure are applicable.
Figure 3:
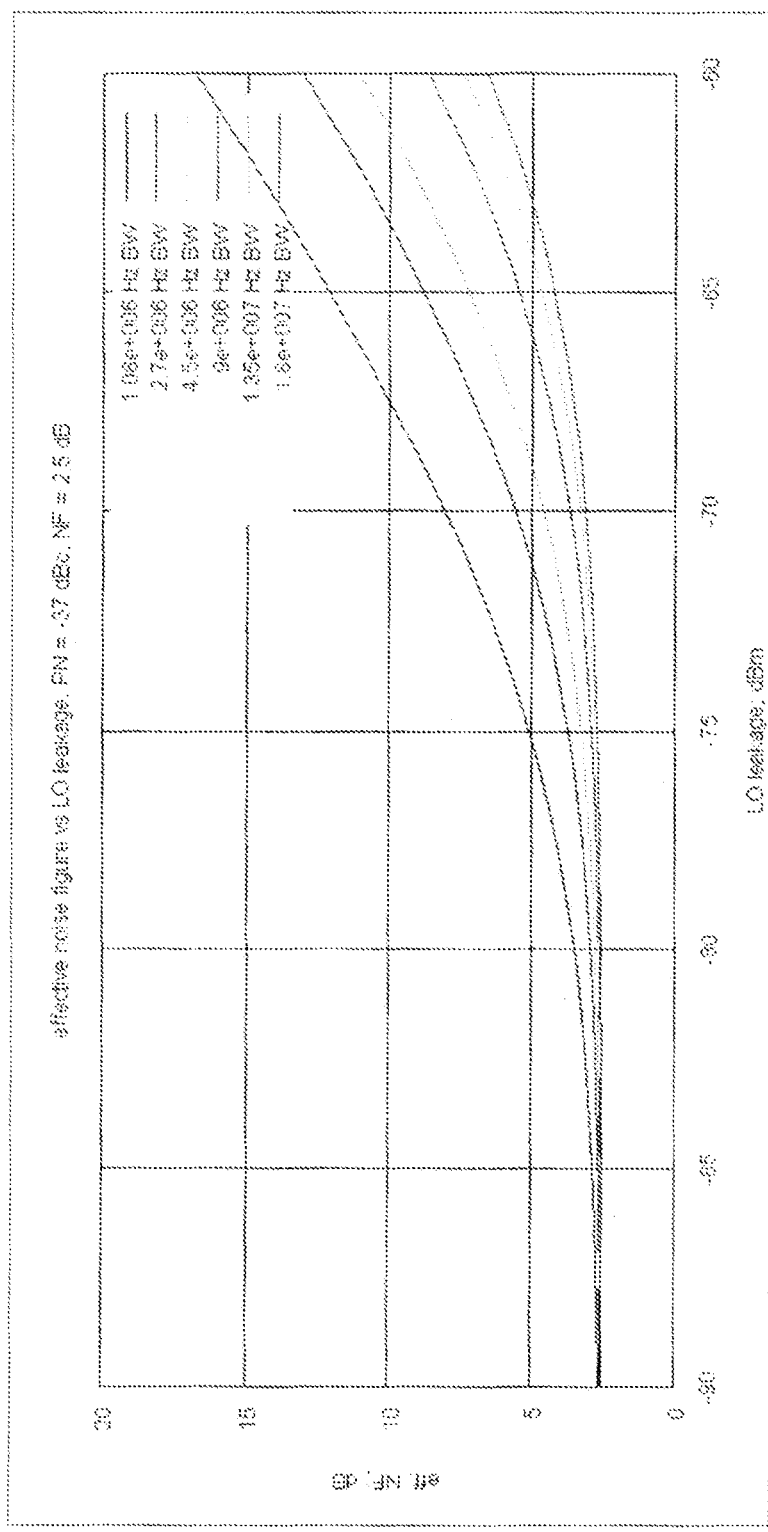
FIG. 3 shows a graph illustrating a receiver noise figure over LO leakage in a mixer-first receiver architecture.

The thus illustrated apparatus according to embodiments of the present disclosure is dedicated for use at a radio receiver. e.g. a radio receiver of a cellular handset a radar equipment, a satellite equipment or the like, but is independent of the technical realization of the receiver part or the receiver. Namely, the thus illustrated apparatus according to embodiments of the present disclosure is equally applicable to any receiver architectures such as e.g. direct conversion and mixer-first (LNA-less) receiver architectures. For example, the frequency converter according to FIG. 4 may comprise the two mixers (and potentially the associated LO divider) according to FIG. 1 or the four mixers (and potentially the associated wide range frequency dividers) according to FIG. 2.

The thus illustrated load apparatus according to embodiments of the present disclosure may be a variable input load and/or a variable output load, as detailed below. Although illustrated separately it is to be noted that the variable load (i.e. a variable input load and/or a variable output load) may be implemented as part of the frequency converter (e.g. a mixing portion or mixers thereof).

The thus illustrated frequency converter according to embodiments of the present disclosure may comprise a mixing portion. The DC components of the output signal of the frequency converter may result from a mixing product of a local oscillator (LO) signal of the frequency converter with a leakage signal component of the local oscillator (LO) signal, which appears at the input of the frequency converter and interacts with the variable load acting on the input of the frequency converter.

The thus illustrated controller apparatus according to embodiments of the present disclosure may comprise at least one processor and at least one memory, thus representing a processing system with corresponding functionality as explained herein.

In the following, for the sake of clarity and simplicity, various topologies and functions according to embodiments of the present disclosure are explained with reference to a mixer-first (LNA-less) receiver architecture with two mixers in the frequency converter, i.e. a 2-phase LO frequency converter, by way of example only, yet without restricting applicability of embodiments of the present disclosure to such receiver architecture. As mentioned above, it is noted that embodiments of the present disclosure are equally applicable to direct-conversion receiver architecture and/or mixer-first (LNA-less) receiver architecture with 2, 4, 8, 16, . . . mixers in the frequency converter, i.e. a 2-, 4-, 8-, 16-, . . . -phase LO frequency converter, for example.

It is noted that the example topologies illustrated in FIGS. 5 to 12 are meant as illustrative examples for explanatory purposes only, while (real-world) implementations of the thus exemplified topologies can be more complex by comprising additional elements (such as for example different frontend configurations with RF filters or balancing/matching units). Namely, only those elements are illustrated in the respective topologies, which directly relate to or are associated with embodiments of the present disclosure.

Figure 5:
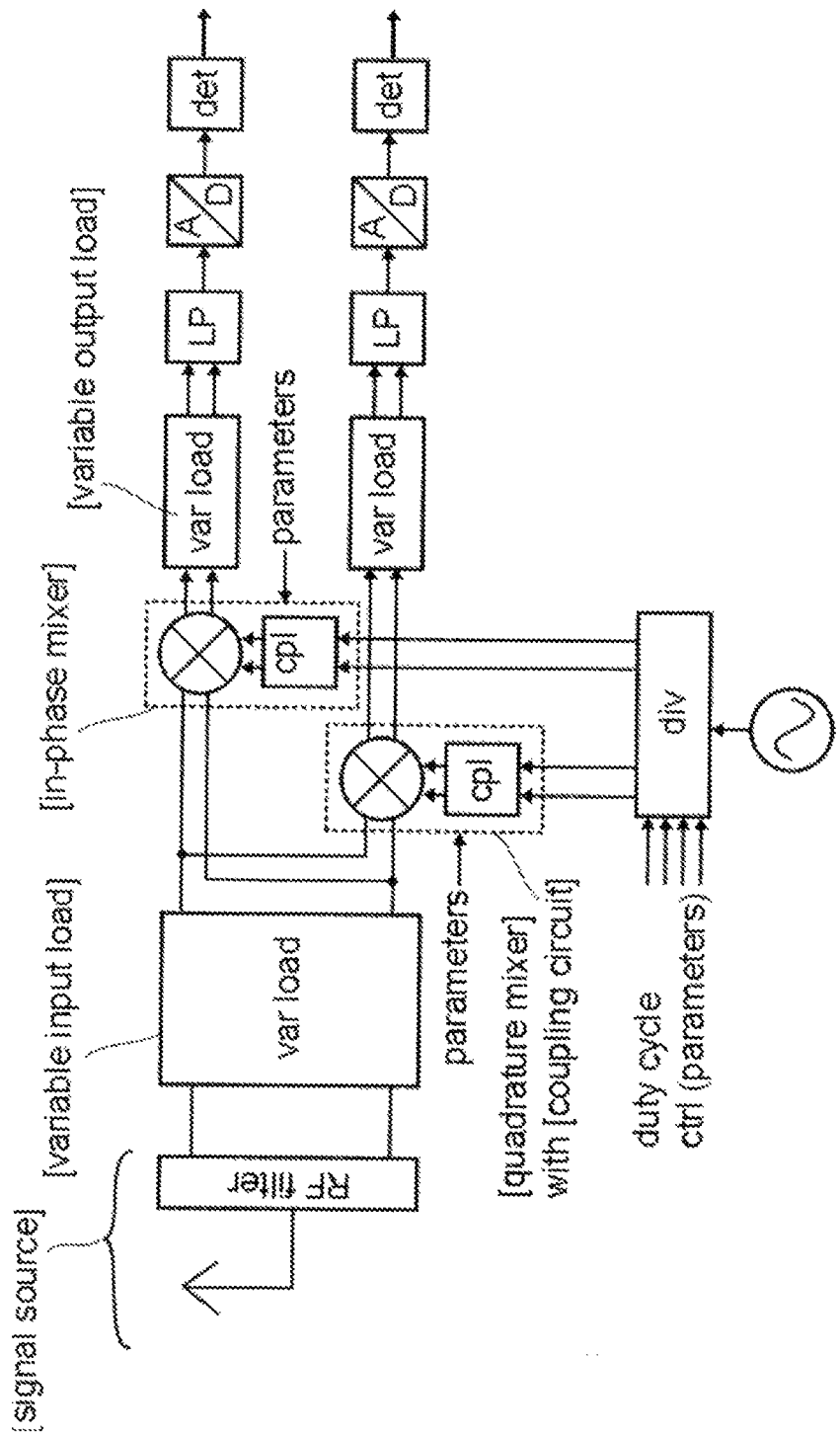
FIG. 5 shows a schematic diagram of a first example topology of a mixer-first receiver architecture according to embodiments of the present disclosure.

FIG. 5 shows a schematic diagram of a first example topology of a mixer-first receiver architecture according to embodiments of the present disclosure. It is noted that all elements except for the signal source may be implemented on a RFIC, modem chipset, or the like.

As shown in FIG. 5, at the input of a frequency converter (exemplified by way of an in-phase mixer and a quadrature mixer and their associated LO inputs), a radio signal received via a signal source comprising an antenna and a RF filter (such as a duplexer) is input to the frequency converter via a variable input load. The LO inputs comprise corresponding coupling (cpl) elements from a LO divider or buffer (div) which performs a phase shifting of a LO source signal (from a (double-frequency) synthesizer) so as to generate the LO signals for the in-phase mixer and the quadrature mixer. At the output of the frequency converter, i.e. in each output branch corresponding to the two mixers, an output signal is subject to low-pass (LP) filtering, A/D conversion, after passing a variable output load, before being eventual output to a digital data path or the like. In the output signal, there are contained DC components resulting from static offsets in the frequency converter and/or self-mixing effects (as explained below) and/or second-order linearity (IIP2) effects (i.e. unwanted rectifications of a large received signal or transmit leakage).

In a calibration period, the input signal may be connected to or disconnected from the input of the mixers by a controller (not shown). Accordingly, there may or may not be a received radio signal from the signal source at the input of the frequency converter, apart from a LO leakage signal. The signal (i.e. the LO leakage signal with or without (superimposition of) the received radio signal) is processed as outlined above for the received radio signal. In addition thereto, the signal is subject to a detection/measurement of the DC components at the output of the frequency converter by a detector (det) in each output branch, respectively. The detected/measured DC components from the detectors are provided to the controller (not shown) which observes a variation of the DC components of the output signals for different states of the variable input and output loads, and adjusts one or more parameters relating to the frequency converter such that the observed variation is reduced.

The detected/measured DC components could result from static offsets in the frequency converter and/or self-mixing effects. The self-mixing effects result from one or more of a self-mixing between an in-phase LO signal and leakage of itself to the mixer input, a self-mixing between a quadrature LO signal and leakage of itself to the mixer input, self-mixing between an in-phase LO signal and leakage of a quadrature LO signal in combination with some phase shill, e.g. reflection at the antenna and self-mixing between a quadrature LO signal and leakage of an in-phase LO signal in combination with some phase shift, e.g. reflection at the antenna.

By sequentially setting different states of the variable load (i.e. the variable input and/or output loads) by the controller, i.e. timely varying the load applicable to the frequency converter, the static offsets (even with presence of LO leakage) and the self-mixing effects (due to presence of LO leakage) can be separated from each other. As described below, any one of the different states of the variable load may be applied with the input signal, i.e. the received radio signal, being connected or disconnected.

Accordingly, the subject apparatus or receiver, i.e. the controller thereof, may perform occasional re-/calibration, i.e. with a predetermined timing (e.g. periodically, or when required or desired, i.e. upon determination of a requirement for re-/calibration. Although not restricted thereto, it many be beneficial to perform re-/calibration during normal operation (i.e. with the input signal being connected to the frequency converter) in an occasional/timing-based manner, and to perform re-/calibration outside normal operation (i.e. with the input signal being disconnected from the frequency converter) in a requirement/desire-based manner (so as to disrupt normal operation only when expedient).

For performing such disruption of normal operation only when expedient, the controller may determine a requirement (or desire) of calibration (i.e. variation observation and parameter adjustment) on the basis of the observed magnitude of LO leakage. Namely, the controller may check for the presence of strong LO leakage that would require a re-/calibration, e.g. when the observed LO leakage exceeds a predetermined threshold, environmental conditions change in a predetermined manner, or the like. That is, re-/calibration may be initiated and performed (and the input signal may be disconnected) only when such requirement (or desire) is determined.

Hence, parameter/s could be adjusted accordingly, which influence/s the (corresponding) DC components such that the observed variation between different load states is reduced. As indicated in FIG. 5, such parameters may be any one of those of the in-phase mixer or a coupling element thereof to the LO divider, those of the quadrature mixer or a coupling element thereof to the LO divider, aid/or those of the LO divider (e.g. a duly cycle for each divider output). In particular, such parameters may be any one of a static LO offset at the in-phase mixer (with absence of an LO signal, thus not affecting LO leakage), a static DC offset at the quadrature mixer (with absence of an LO signal, thus not affecting LO leakage), an imbalance at the in-phase mixer (affecting LO leakage on the in-phase branch), an imbalance at the quadrature mixer (affecting LO leakage on the quadrature branch), a static DC offset at the in-phase mixer (with presence of an LO signal), and a static DC offset at the quadrature mixer (with presence of an LO signal). The latter parameters, i.e. the static DC offsets with presence of an LO signal, are particularly relevant if it turns out that the presence of an LO signal alone causes DC components at the mixer output to change, regardless of the variable (input and/or output) load, and may thus be regarded as "large signal" static DC offsets as compared with "small signal" static DC offsets with absence of an LO signal.

In view of the aforementioned parameters, a parameter adjustment according to embodiments of the present disclosure may be effected in various ways. As one example, a number of measurements equal to the number of parameters may be performed, and a linear equation system for the parameters, i.e. in the same number of parameters, may be solved. As another example, more measurements than the number of parameters may be performed, and parameters may be found using a least-square solution to an equation system in the number of parameters, that relates parameters to measurement results.

Figure 6:
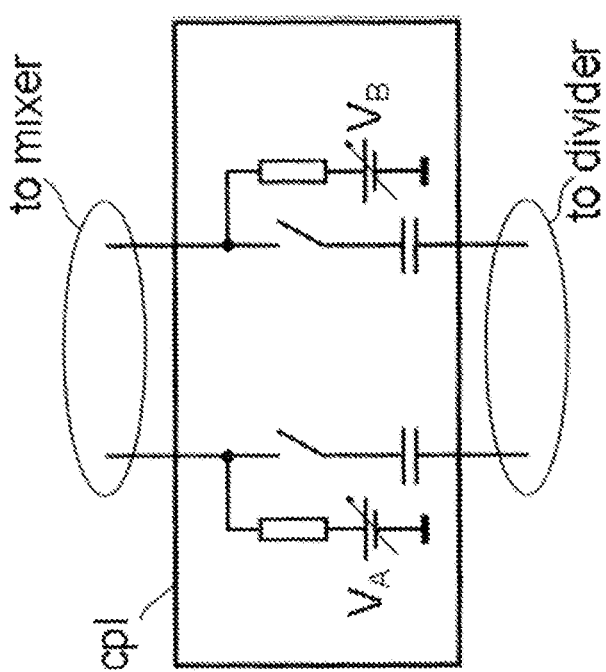
FIG. 6 shows a schematic diagram of a circuit structure of a coupling element it the example topology according to FIG. 5.

FIG. 6 shows a schematic diagram of a circuit structure of a coupling element in the example topology according to FIG. 5.

The example coupling element according to FIG. 6 could be used as the coupling element for the in-phase mixer and/or the quadrature mixer in the topology according to FIG. 5. Therein, the left branch may control a forward mixer path of a respective mixer, and the right branch may control a reverse miner branch of the respective mixer. Opening both switches and setting $V_A$, $V_B$ to a low level (for example 0V) disables the respective mixer, while closing both switches enables the respective mixer, wherein $V_A$, $V_B$ are adjustable (imbalance) parameters of the mixer. The switching states of these switches and the values of these voltage sources may be controlled by the controller (not shown) in the topology of FIG. 5.

According to embodiments of the present disclosure, controlling the switching states of, i.e. switching, these switches changes a configuration of the frequency converter, and controlling the values of i.e. tuning, these voltage values adjusts corresponding parameters of the frequency converter.

Figure 7:
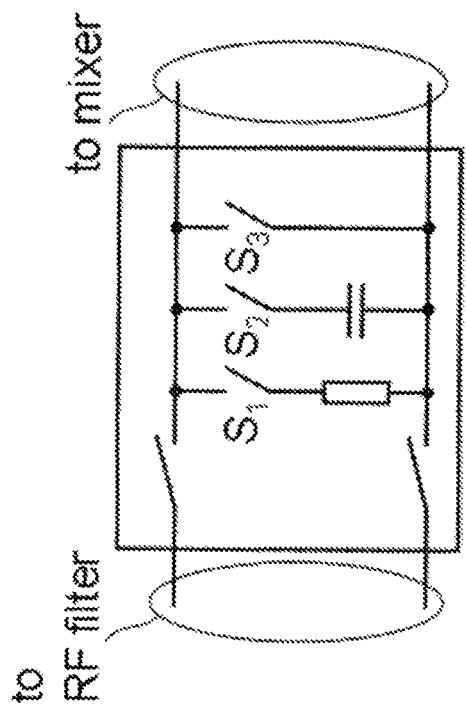
FIG. 7 shows a schematic diagram of a circuit structure of a variable input load element in the example topology according to FIG. 5.

FIG. 7 shows a schematic diagram of a circuit structure of a variable input load element in the example topology according to FIG. 5.

The example variable load element according to FIG. 7 could be used as the variable input load in the topology according to FIG. 5. Therein, a switch is connected between the input of the frequency converter (mixer portion thereof) and the signal source of the input signal of the frequency converter, which enables dis-/connection of the input signal from the signal source. Further, there are connected, in parallel to the input of the frequency converter (mixer portion thereof), a short circuit switch of the input of the frequency converter, a switchable shut resistor, and a switchable capacitor.

Accordingly, one switch for dis-/connection of the input signal from the signal source is provided, the switching state of which may be controlled by the controller (not shown) in the topology of FIG. 5. Further, three switches $S_1$, $S_2$ and $S_3$ are provided, the switching states of which may be controlled by the controller (not shown) in the topology of FIG. 5. Opening all of these three switches causes a high-impedance load or input termination at the input of the frequency converter, whereby LO leakage is maximized, if it acts as an ideal voltage source towards the RF input. Closing the switch $S_3$ causes a low-impedance load or input termination at the input of the frequency converter, whereby LO leakage is maximized, if it acts as an ideal current source towards the RF input. Alternatively, closing the switch $S_2$ may achieve the same, without causing a change in the DC level. If the frequency converter (i.e. any mixer thereof) is balanced and does not cause LO leakage to the RF input, opening/closing the switches $S_1$, $S_2$ (and $S_3$) causes no change in the LO leakage level and therefore (after mixing with the LO signal) in the DC level at the output of the frequency converter.

According to embodiments of the present disclosure, controlling the switching states of, i.e. switching, these switches changes state of the variable load.

Figure 8:
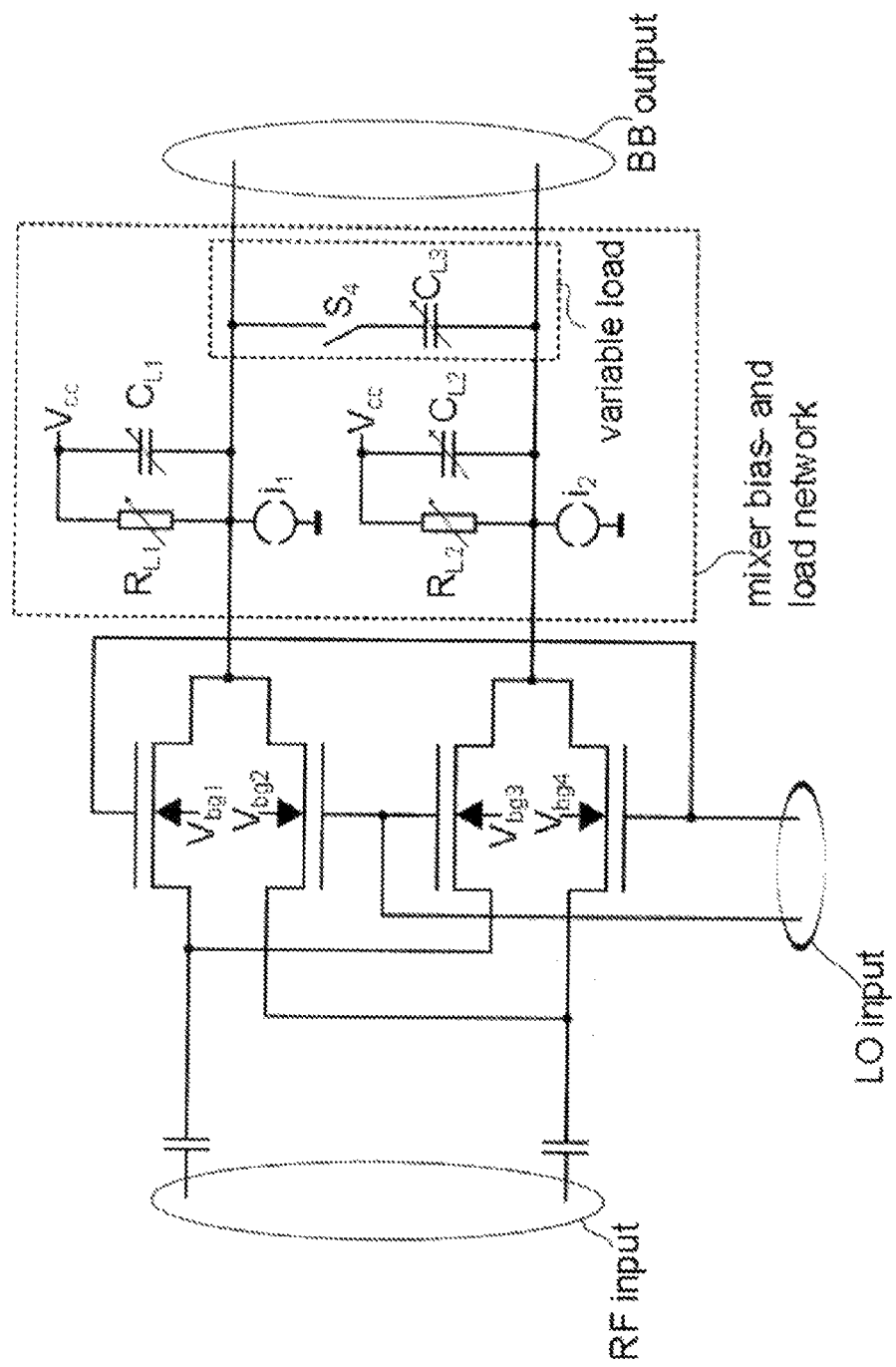
FIG. 8 shows a schematic diagram of a circuit structure of a mixer portion and a variable output load element in the example topology according to FIG. 5.

FIG. 8 shows a schematic diagram of a circuit structure of a mixer portion and a variable output load element in the example topology according to FIG. 5.

The example circuit structure according to FIG. 8 could be used for the mixers and as the variable output load in the topology according to FIG. 5. Therein, $V_{bg1 \ldots 4}$ represent back-gate voltages (as parameters of the mixers), and $R_{L1/2}$, $C_{L1/L2/L3}$, $i_{1/2}$ represent parameters of components that form a mixer bias and load network (wherein $R_{L1/2}$, $C_{L1/L2}$, $i_{1/2}$ represent parameters of the mixers). Either one can be switched or varied/tuned to implement a variable load at the output of the frequency converter. For example, disconnecting $C_{L3}$ by opening switch $S_4$ will increase the output impedance towards LO leakage. A LO leakage current from the LO input to the BB output may create a higher voltage swing when the switch $S_4$ is open, and thus cause stronger leakage towards the RF input. If parameters (i.e. the back-gate voltages) are tuned so that LO-to-output leakage is suppressed, opening or closing the switch S4 makes no difference, LO leakage to the RF input remains unchanged, and the DC level at the output remains unchanged. The switching states of this switch and the values of these tunable elements may be controlled by the controller (not shown) in the topology of FIG. 5.

As shown in FIG. 8, the variable load arranged to act on the output of the frequency converter (i.e. the variable output load) may comprise (at least) a switchable capacitor connected in parallel to the output of the frequency converter. Thereby, a variable output termination at the output of the frequency converter is provided.

According to embodiments of the present disclosure, controlling the switching state of, i.e. switching this switch and/or controlling the value of (at least) $C_{L3}$ (and/or any one of $R_{L1/2}$, $C_{L1/L2}$, $i_{1/2}$) changes a state of the variable load. Further, controlling the values of, i.e. turning, any one of $V_{bg1 \ldots 4}$, $R_{L1/2}$, $C_{L1/L2}$, $i_{1/2}$ adjusts corresponding parameters of the frequency converter.

Although not specifically illustrated, referring to the example topology according to FIG. 8, a configuration of the frequency converter may be set by a controller (not shown) in that a current source ($i_1$, $i_2$) at any one of the outputs of the mixers of the frequency converter can be set at desirable direct current values.

For example, various mixer configurations could be set by setting $i_1$ to 400 μA and $i_2$ to 400 μA, setting $i_1$ to 400 μA and $i_2$ to 450 μA, setting $i_1$ to 450 μA and $i_2$ to 400 μA, or setting $i_1$ to 450 μA and $i_2$ to 450 μA.

Further, referring to the example topology according to FIG. 8, a configuration of the frequency converter may be set by a controller (not shown) in that any one of the thus exemplified tunable parts ($V_{bg1 \ldots 4}$, $R_{L1/2}$, $C_{L1/L2/L3}$) of the mixers of the frequency converter can be set at desirable direct values.

Figure 9:
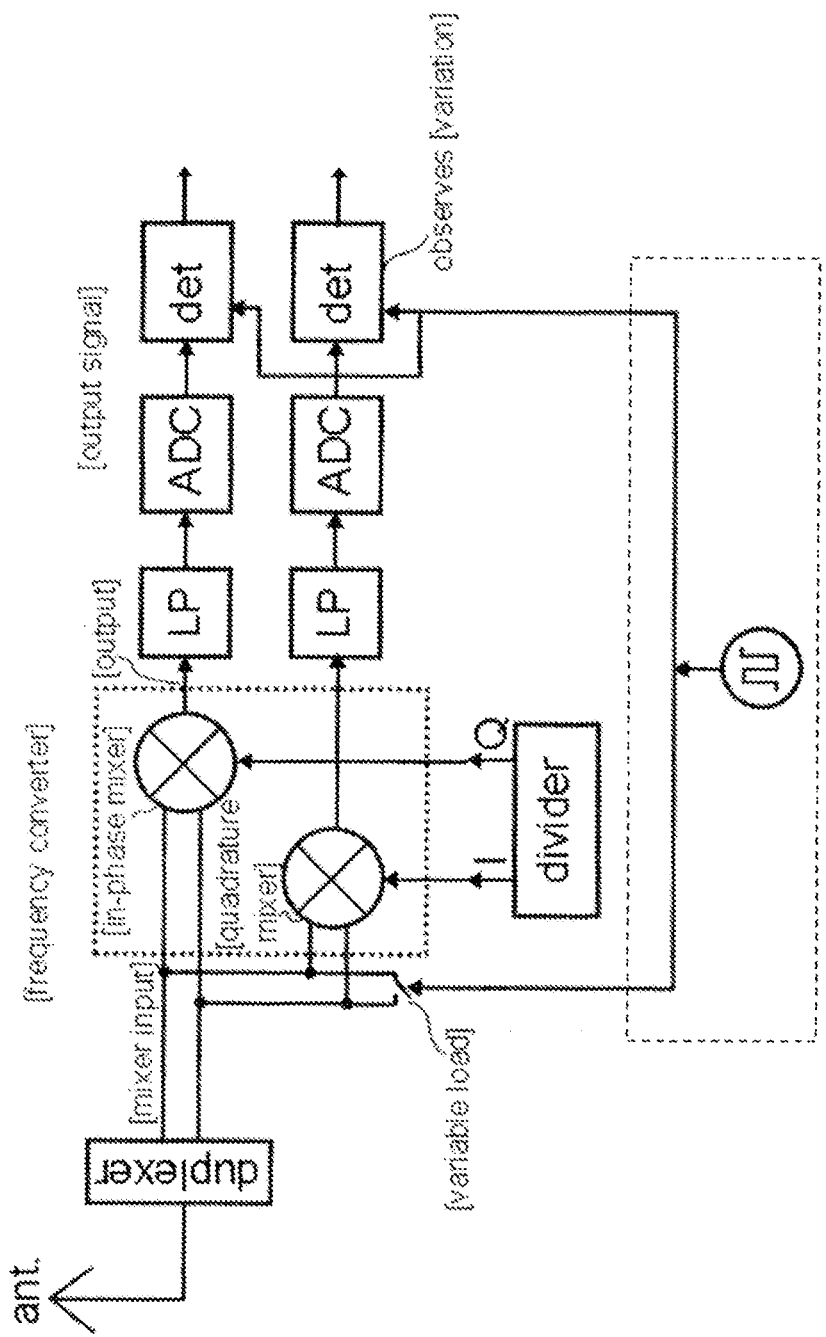
FIG. 9 shows a schematic diagram of a second example topology of a mixer-first receiver architecture according to embodiments of the present disclosure.

FIG. 9 shows a schematic diagram of a second example topology of a mixer-first receiver architecture according to embodiments of the present disclosure.

As shown in FIG. 9, only a variable load arranged to act on the input of the frequency converter (i.e. the variable input load) is provided in this example topology. Further, a timing control of the variable load and the detector (i.e. the detectors in both output branches) is indicated.

As regards the variable input bad, it is indicated that the (state of the) variable load is changeable by way of a switching operation.

As regards the timing control, which is performed by the controller being indicated by a dashed box in FIG. 9, the variable (input) load and the detector are controlled such that the (state of the) variable load is sequentially changed and the DC components in the output signal of the frequency converter are detected/measured for the respective (states of the) variable load changes in the calibration period. Such timing control may be based on a test/switching pattern which is exemplarily indicated as a rectangular waveform.

The waveform pattern may be of a predetermined frequency, for example the frequency of a sine wave, or the fundamental frequency of a rectangular wave. Further, the waveform pattern could also be represented by a bit sequence, such as a pseudo-random bit sequence, and a self-mixing product at the output of the frequency converter could be detected by correlating an output signal of the frequency converter with the bit sequence.

By way of such timing control, a coherent detection of the self-mixing product at the output of the frequency converter may be effected (e.g. by multiplication with the test/switching pattern and integration, with the possibilty of increasing the accuracy by increasing the integration time).

Figure 10:
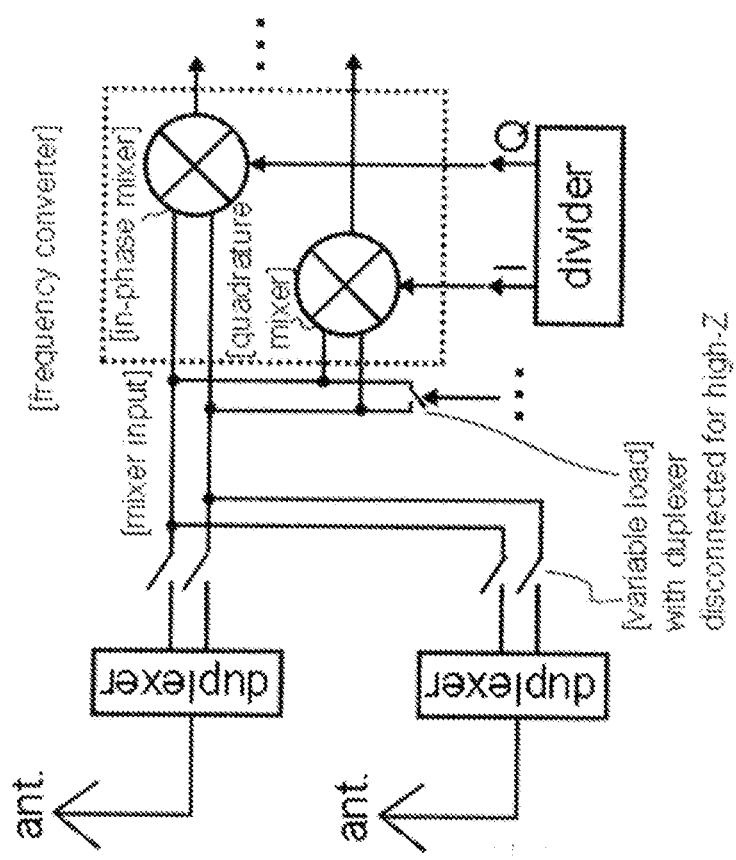
FIG. 10 shows a schematic diagram of a third example topology of a mixer-first receiver architecture according to embodiments of the present disclosure.

FIG. 10 shows a schematic diagram of a third example topology of a mixer-first receiver architecture according to embodiments of the present disclosure.

As shown in FIG. 10, the variable input load may comprise a switch that connects the input of the frequency converter to at least one antenna (via a corresponding RF filter, duplexer, balun, or the like), i.e. at least one signal source. Accordingly, there may be provided a variable input termination as a variable load that is independent of the signal source (e.g. the antenna), thus enabling that no radiation of LO leakage is caused during a calibration period, whilst the right-side switch may be considered a low-ohm shunt resistor. In an actual RFIC, the illustrated switches may be used to switch one RFIC input to multiple duplexers in order to support several bands, for example.

Figure 11:
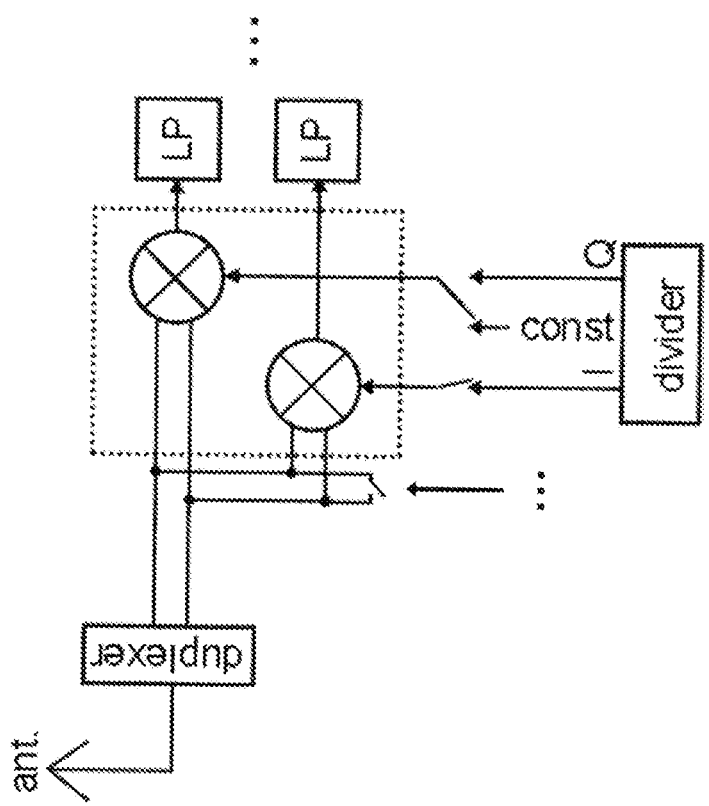
FIG. 11 shows a schematic diagram of a fourth exemplary topology of a mixer-first receiver architecture according to exemplary embodiments of the present disclosure.

FIG. 11 shows a schematic diagram of a fourth example topology of a mixer-first receiver architecture according to embodiments of the present disclosure.

As shown in FIG. 11, a configuration of the frequency converter may be set by a controller (not shown). Namely, one of the mixers of the frequency converter may be disabled by supplying a constant signal to its LO input (instead of its dedicated LO signal), while the other one of the mixers of the frequency converter may be enabled. Thereby, no LO leakage is caused for the disabled mixer (by its LO signal), and thus the LO leakage for the enabled mixer (by its LO signal) may be isolated in terms of its effects to the DC components at the output of the frequency converter.

In the example configuration according to FIG. 11, the LO signal of the in-phase mixer is provided to the LO input of the in-phase mixer, while a predetermined constant signal is provided to the LO input of the quadrature mixer. In such configuration, the DC components of the output signal at the output of the in-phase mixer are detected for the respective states of the variable load in the calibration period, and at least one parameter of the in-phase mixer is adjusted on the basis of the observed variation of the detected DC components.

The configuration may equally be vice versa. That is, the LO signal of the quadrature mixer may be provided to the LO input of the quadrature mixer, while a predetermined constant signal is provided to the LO input of the in-phase mixer. In such configuration, the DC components of the output signal at the output of the quadrature mixer are detected for the respective states of the variable load in the calibration period, and at least one parameter of the quadrature mixer is adjusted on the basis of the observed variation of the detected DC components.

Such configuration of the frequency converter can also be employed in is calibration as follows. First, the supply of the LO signal is inhibited for both mixers (by supplying a predetermined constant signal to the LO inputs of both mixers), and the static DC offset of both mixers is measured with absence of their LO signal, respectively. Secondly, the LO leakage of both mixers are measured one after the other. To this end, in accordance with the illustrated configuration according to FIG. 11, the LO signal of the in-phase mixer is provided to the LO input of the in-phase mixer, while a predetermined constant signal is provided to the LO input of the quadrature mixer, and the DC components of the output signal at the output of the in-phase mixer are detected for the respective states of the variable load in the calibration period, thereby observing the variation caused by the variable input termination of the in-phase mixer, as a first measurement. Then, contrary to the illustrated configuration according to FIG. 11, the LO signal of the quadrature mixer is provided to the LO input of the quadrature mixer, while a predetermined constant signal is provided to the LO input of the in-phase mixer, and the DC components of the output signal at the output of the quadrature mixer are detected for the respective states of the variable load in the calibration period, thereby observing the variation caused by the variable input termination of the quadrature mixer, as a second measurement. Thereupon, at least one parameter is adjusted on the basis of the measured static DC offset of the two mixers and the observed variation of the detected direct current components of the first and second measurements, i.e. the first and second measurements. In this regard, it is noted that the first and second measurements may also be performed in a different temporal sequence.

Figure 12:
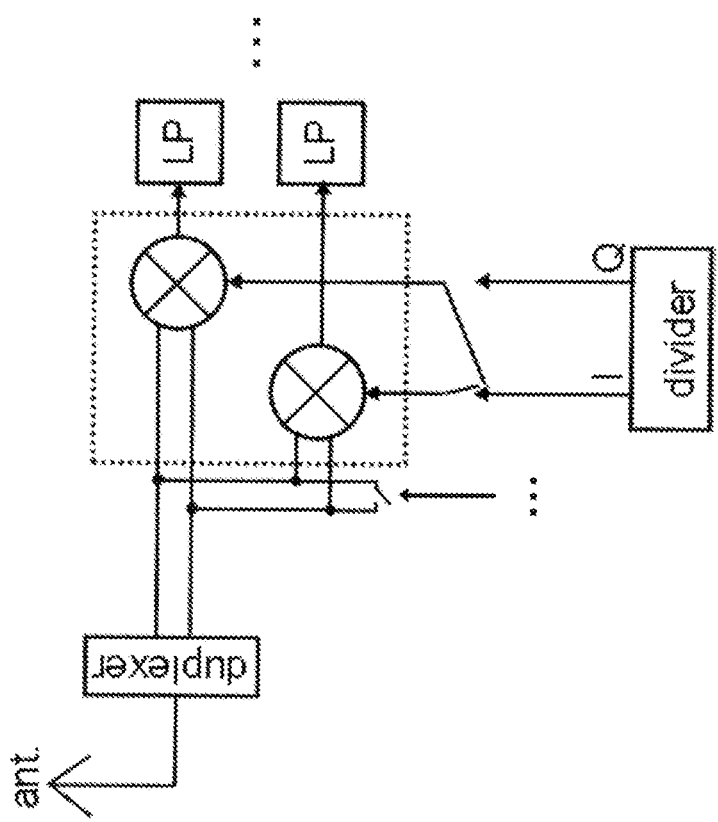
FIG. 12 shows a schematic diagram of a fifth example topology of a mixer-first receiver architecture according to embodiments of the present disclosure.

FIG. 12 shows a schematic diagram of a fifth exemplary topology of a mixer-first receiver architecture according to embodiments of the present disclosure.

As shown in FIG. 12, a configuration of the frequency converter may be set by a controller (not shown). Namely, all of the mixers of the frequency converter may be enabled by supplying the same LO signal to their LO inputs, respectively. Running both in-phase and quadrature mixers with the same LO signal (i.e. without 90° phase shift) allows isolation of phase shifted reflections at the output of the frequency converter.

In the example configuration according to FIG. 12, the LO signal of the in-phase mixer is supplied to both the in-phase and quadrature mixers. Yet, the configuration may equally be vice versa in that the LO signal of the quadrature mixer is supplied to both the in-phase and quadrature mixers.

Such configuration of the frequency converter can be employed in its calibration as follows. First, the LO signal of the in-phase/quadrature mixer is supplied to both mixers, and the DC components of the output signal at an output of at least one of the mixers are detected for the respective states of the variable load as a first measurement. Secondly, the LO signal of the in-phase mixer is supplied to the in-phase mixer and the LO signal of the quadrature mixer is supplied to the quadrature mixer, and the DC components of the output signal at an output of at least one of the mixers are detected for the respective states of the variable load as a second measurement. Then, at least one parameter is adjusted on the basis of the observed variation of the detected DC components of the first and second measurements, i.e. on the basis of the first and second measurements.

In view of the above, various procedures according to embodiments of the present disclosure may be implemented, i.e. realized by way of corresponding control operations by the controller.

Figure 13:
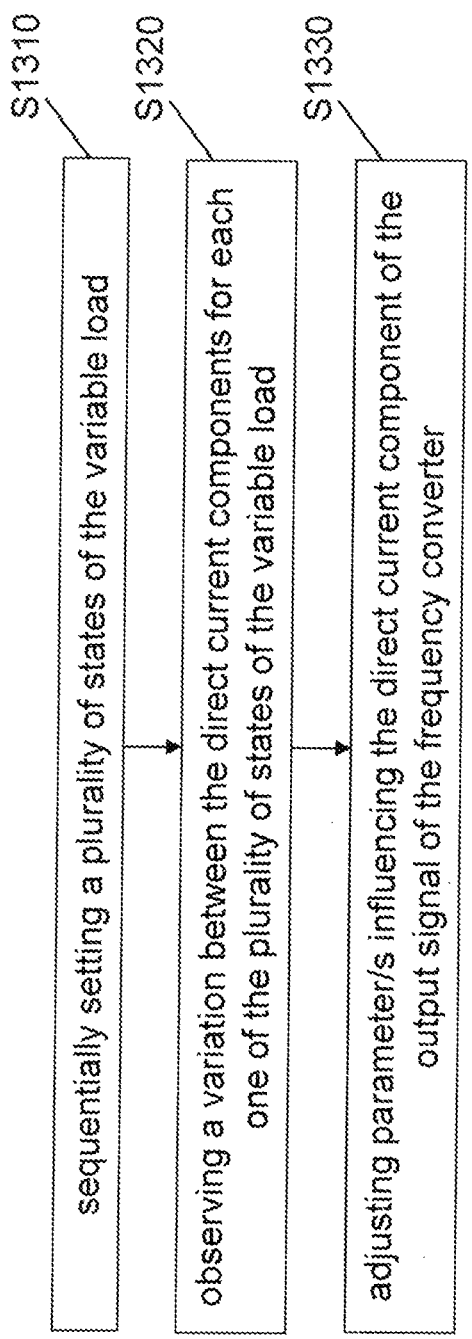
FIG. 13 shows a flowchart of a first example procedure according to embodiments of the present disclosure.

FIG. 13 shows a flowchart of a first example procedure according to embodiments of the present disclosure.

As shown in FIG. 13, a procedure according to embodiments of the present disclosure comprises an operation (S1310) of sequentially setting a plurality of states of a variable load, an operation (S1320) of observing a variation between direct current components at an output of the frequency converter for each one of the plurality of states of the variable load, and an operation (S1330) of adjusting at least one parameter influencing the direct current component of the output signal of the frequency converter such that the observed variation is reduced.

Although not shown in FIG. 13, a procedure according to embodiments of the present disclosure may additionally comprise an operation of disconnecting an input signal from an input of a frequency converter, which operation may take place prior to operations S1310 to S1330 of FIG. 13. Specifically, a corresponding procedure may be such that one or more of the operations S1310 to S1330 of FIG. 13 are executed with the input signal being disconnected. For example, the input signal may be disconnected as one of the states of the variable load in the course of the variable load setting, the input signal may be disconnected prior to the variable load settings and may be reconnected after observation of the variations or after parameter adjustment.

Figure 14:
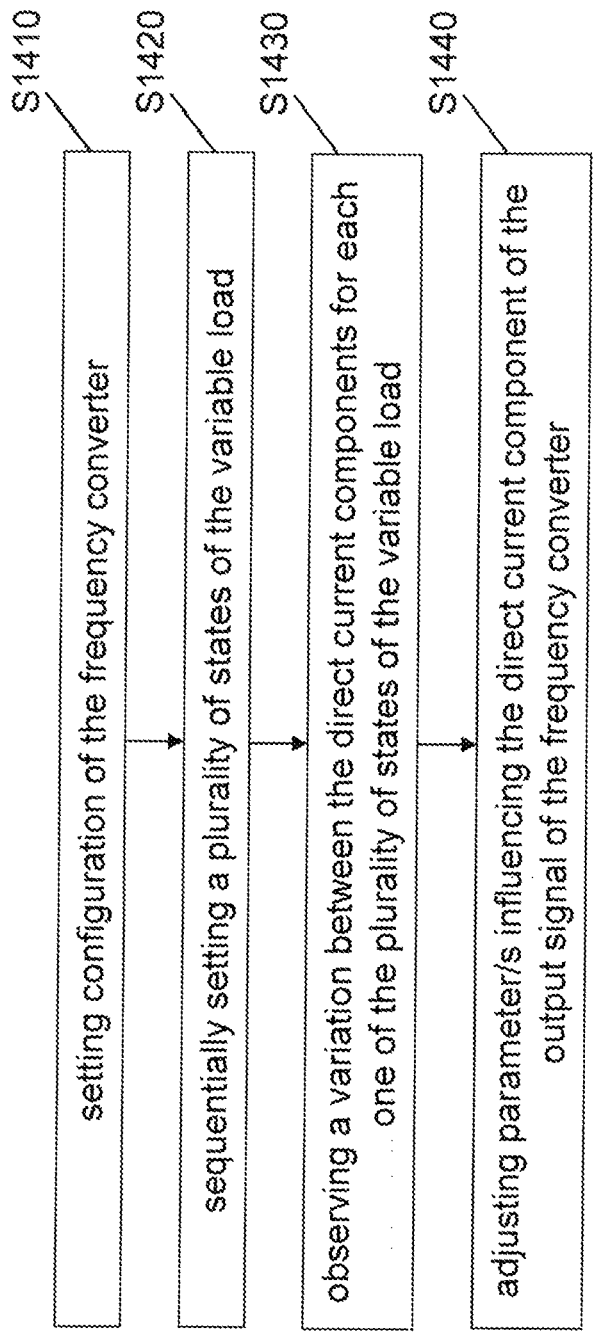
FIG. 14 shows a flowchart of a second example procedure according to embodiments of the present disclosure.

FIG. 14 shows a flowchart of a second example procedure according to embodiments of the present disclosure.

As shown in FIG. 14, a procedure according to embodiments of the present disclosure comprises, in addition to the operations of the procedure according to FIG. 13 (i.e. the operations S1420, S1430 and S1440 correspond to the operations S1310, S1320 and S1330, respectively), an operation (S1410) of setting a configuration of the frequency converter for which the variation of the direct current components is observed. Namely, the calibration of the frequency converter may be performed in/for a specific configuration thereof, such as those described in connection with FIGS. 8, 11 and 12 above.

Although not shown in FIG. 14, a procedure according to embodiments of the present disclosure may additionally comprise an operation of disconnecting an input signal from an input of a frequency converter, which operation may take place prior to operations S1410 to S1430 of FIG. 14. Specifically, a corresponding procedure may be such that one or more of the operations S1410 to S1430 of FIG. 14 are executed with the input signal being disconnected. For example, the input signal may be disconnected as one of the states of the variable load in the course of the variable load setting, the input signal may be disconnected prior to the variable load settings (before or after the configuration setting) and may be reconnected after observation of the variations or after parameter adjustment.

Figure 15:
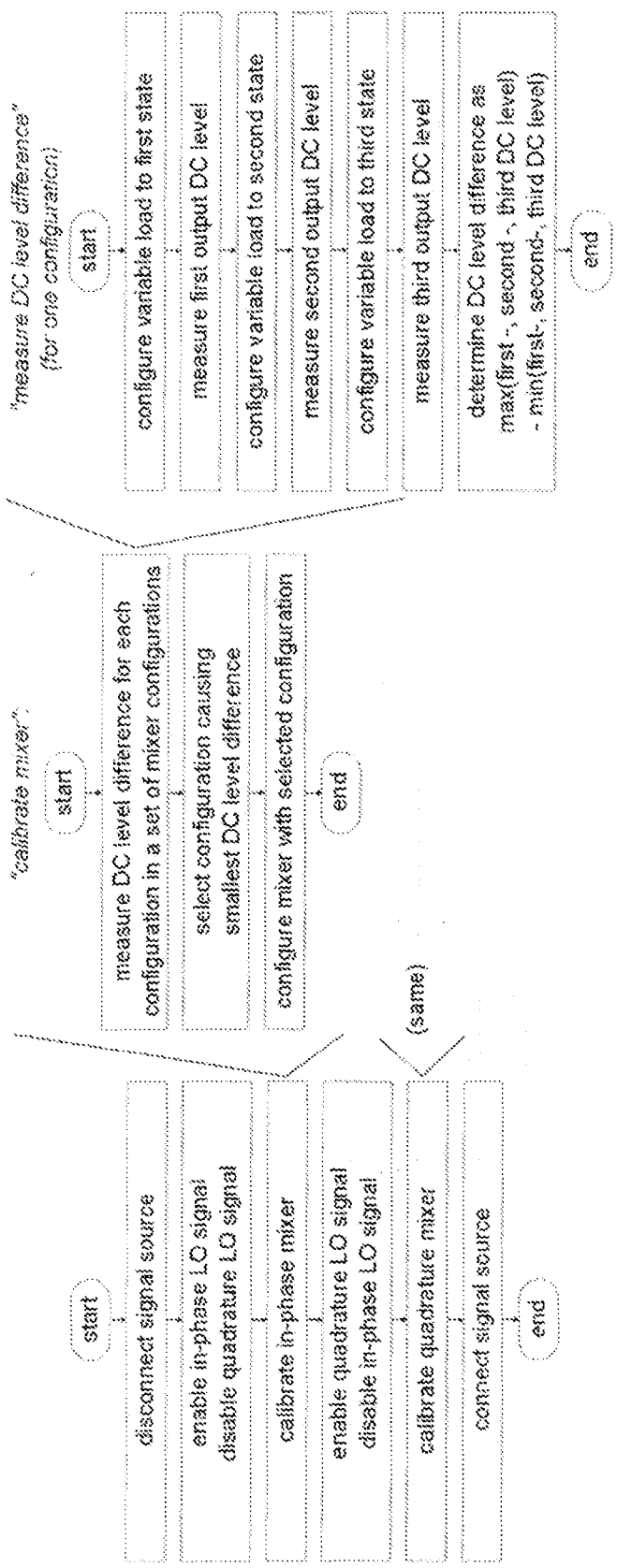
FIG. 15 shows a flowchart of a third example procedure according to embodiments of the present disclosure.

FIG. 15 shows a flowchart of a third example procedure according to embodiments of the present disclosure. Such a procedure is specifically applicable to an apparatus with a frequency converter comprising an in-phase mixer and a quadrature mixer, as exemplarily illustrated in FIGS. 5 and 8 to 12.

As shown in FIG. 15, a procedure according to embodiments of the present disclosure comprises an operation of disconnecting an input signal from an input of a frequency converter, operations of calibrating the frequency converter by separately calibrating both mixers of the frequency converter one after the other, and an operation of re-/connecting the input signal to the input of the frequency converter after completion of the calibration of the frequency converter (i.e. both mixers thereof). Although the flow chart describes calibration of the mixers in an example order, the order may be freely selected without departing from the present disclosure.

In the calibration of a mixer, the mixer to be calibrated is enabled whilst the other mixer is disabled (e.g., as described above in connection with FIGS. 6 and 11). In such configuration, the enabled mixer is calibrated by measuring DC levels (DC components) and a difference/variation thereof for each configuration (i.e. for each state of the variable load) in a set of configurations of the frequency conversion or its mixers (i.e. for various parameters thereof), a configuration (i.e. set of parameters) causing the smallest DC level difference is selected, and the frequency conversion or its mixers is/are configured with the selected configuration (i.e. set of parameters).

In the measurement of the DC level difference/variation, the variable load is re-/configured for a predetermined number of times with predefined states (e.g. switching states of the aforementioned switches $S_1$ to $S_4$), e.g. three times as exemplified in FIG. 15, the DC level at the output is measured for each variable load re-/configuration, and the DC level difference/variation is measured/observed in a predetermined manner based on the thus measured DC levels for each variable load re-/configuration. For example, as exemplified in FIG. 15, the DC level difference/variation may be determined as the difference between a maximum value of the predetermined number of DC level measurement values and a minimum value of the predetermined number of DC level measurement values.

For example, various variable load configurations/states could be set by the following switching states of the switches $S_1$ to $S_4$: {open, open, open, closed}, {open, open, open, open}, and {open, closed, open, closed}. Other possible variable load configurations/states may use different combinations of switches, e.g. selecting those switches that cause the highest DC level difference/variation for a given amount of LO leakage in a given topology (which can be found by experiment, for example).

By virtue of embodiments of the present disclosure, as explained above, there is provided techniques for calibration of a frequency converter for reducing a leakage-based direct current component at an output of the frequency converter, thus achieving enhancements and/or improvements in terms of leakage calibration for a frequency converter. Thereby, LO leakage as well as second order linearity (IIP2) can be improved for a thus calibrated frequency converter, and any leakage-based performance degradation of the frequency converter (or the receiver or receiver part including the same) can be reduced.

The calibration techniques according to embodiments of the present disclosure are based on the provision and time-varying operation of a variable load at/for a frequency converter to be calibrated and a parameter adjustment on the basis of thus observed variations in DC components for different operating states of the variable load at an output of the frequency converter. By the time-varying operation of the variable load, independent (combinations of) mechanisms/effects/contributors, which influence the DC components at the output of the frequency converter (due to LO leakage via the imbalanced frequency converter), can be studied and addressed by way of parameter adjustment/s accordingly. Referring to the above examples, one mechanism/effect/contributor corresponds to the self-mixing product of a LO signal, which can be separated from static DC offsets by way of a timely variation of the variable load, another mechanism/effect/contributor corresponds to the influence of a single mixer out of plural mixers of the frequency converter, which can be separated by (additionally) disabling the other mixer/s, and still another mechanism/effect/contributor corresponds to phase shifted reflections, which can be separated by (additionally) supplying the same LO signal (with the same phase) to all mixers of the frequency converter.

Accordingly, an accurate calibration of a frequency converter is enabled even without a need for directly sensing its own LO leakage. Such calibration is effective in that the actual imbalance of the frequency converter, which causes DC offsets at is output, may be fixed (instead of merely adding observed "symptoms" of the LO leakage with opposite sign).

The calibration techniques according to embodiments of the present disclosure are independent of an actual use of a corresponding apparatus. Accordingly, such calibration can be performed at the production stage by way of on-wafer testing thus enabling that samples with insufficient performance (which do not allow an acceptable calibration result) can be spotted and sorted out even before packaging.

An apparatus according to embodiments of the present disclosure is applicable to any radio receiver or any radio receiver part, e.g. a radio receiver (part) of any communication terminal equipment, which is operable e.g. with any carrier/band/diversity combinations including diversity receiver architectures. Accordingly, embodiments of the present disclosure are applicable for any recent or future radio system with a single- or multi-carrier transmission scenario.

In general terms, the respective devices/apparatuses (and/or portions thereof) described herein may represent means for performing respective operations and/or exhibiting respective functionalities, and/or the respective devices/apparatuses (and/or portions thereof) may have functions far performing respective operations and/or exhibiting respective functionalities.

In general, it is to be noted that respective functional blocks or elements according to above-described examples can be implemented by any known means, either in hardware and/or software/firmware, respectively, if it is only adapted to perform the described functions of the respective parts.

Generally, any structural means such as a portion or other circuitry of a receiver circuit may refer to one or more of the following (a) hardware-only circuit implementations (such as implementation in only analog and/or digital circuitry) and (b) combinations of circuits and software (and/or firmware), such as (as applicable): (i) a combination of processor(s) or (ii) portions of processor(s)/software (including digital signal processor(s)), software, and memory(ies) that work together to cause an apparatus, such as a mobile phone or server, to perform various functions) and (c) circuits, such as a microprocessor(s) or a portion of a microprocessor(s), that require software or firmware for operation, even if the software or firmware is not physically present. Also, it may also cover an implementation of merely a processor (or multiple processors) or portion of a processor and its (or their) accompanying software and/or firmware, any integrated circuit, or the like.

Generally, any procedural step or functionality is suitable to be implemented as software/firmware or by hardware without changing the idea of the present disclosure. Such software may be software code independent and can be specified using any known or future developed programming language, such as e.g. Java, C++, C, and Assembler, as long as the functionality defined by the method steps is preserved. Such hardware may be hardware type independent and can be implemented using any known or future developed hardware technology or any hybrids of these, such as MOS (Metal Oxide Semiconductor), CMOS (Complementary MOS), BiMOS (Bipolar MOS), BiCMOS (Bipolar CMOS), ECL (Emitter Coupled Logic), TTL (Transistor-Transistor Logic), etc., using for example ASIC (Application Specific IC (Integrated Circuit)) components, FPGA (Field-programmable Gate Arrays) components, CPLD (Complex Programmable Logic Device) components or DSP (Digital Signal Processor) components. A device/apparatus may be represented by a semiconductor chip, a chipset, or a (hardware) module comprising such chip or chipset; this, however, does not exclude the possibility that a functionality of a device/apparatus or module, instead of being hardware implemented, be implemented as software in a (software) module such as a computer program or a computer program product comprising executable software code portions for execution/being run on a processor. A device may be regarded as a device/apparatus or as an assembly of more than one device/apparatus, whether functionally in cooperation with each other or functionally independently of each other but in a same device housing, for example.

Software in the sense of the present description comprises software code as such comprising code means or portions or a computer program or a computer program product for performing the respective functions, as well as software (or a computer program or a computer program product) embodied on a tangible medium such as a computer-readable (storage) medium having stored thereon a respective data structure or code means/portions or embodied in a signal or in a chip, potentially during processing thereof.

Apparatuses and/or means or portions thereof can be implemented as individual devices, but this does not exclude that they may be implemented in a distributed fashion throughout the system, as long as the functionality of the device is preserved. Such and similar principles are to be considered as known to a skilled person.

The present disclosure also covers any conceivable combination of functional and structural features described above, and any conceivable combination of nodes, apparatuses, modules or elements described above, as long as the above-described concepts of functional and structural configuration are applicable.

By virtue of embodiments of the present disclosure, there is provided techniques for calibration of a frequency converter for reducing a leakage-based direct current component at an output of the frequency converter. In an apparatus comprising a frequency converter arranged to perform frequency conversion on an input signal, a variable load arranged to act on at least one of an input and an output of the frequency converter, and a detector arranged to detect a direct current component of an output signal of the frequency converter, a plurality of states of the variable load are sequentially set, a variation between the direct current components for each one of the plurality of states of the variable load is observed, and at least one parameter influencing the direct current component of the output signal of the frequency converter is adjusted such that the observed variation is reduced.

The above embodiments are to be understood as illustrative examples. Further embodiments are envisaged. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of embodiments, which is defined in the accompanying claims.

LIST OF ACRONYMS AND ABBREVIATIONS

3GPP Third Generation Partnership Project
ADC Analog-to-Digital Converter
AMP Amplifier
BB Baseband
BW Bandwidth
DC Direct Current
GLONASS Globalnaya Navigatsionnaya Sputnikovaya Sistema
GPS Global Positioning System
IC Integrated Circuit
IF Intermediate Frequency
IIP2 2nd order Input Intercept Point
LO Local Oscillator
LNA Low Noise Amplifier
LP Low Pass (Filter)
LTE Long Term Evolution
MIX Mixer
NF Noise Figure/Factor
PN Phase Noise
RF Radio Frequency
RFIC Radio Frequency Integrated Circuit
WLAN Wireless Local Area Network

We claim:
1. An apparatus comprising:
a frequency converter configured to perform frequency conversion on an input signal, the frequency converter comprising a first mixer and a second mixer;
a variable load configured to act on at least an input of the frequency converter;
a detector configured to detect a direct current component of an output signal of each of the first and second mixers; and
a controller configured to:
set a configuration of the frequency converter such that a local oscillator signal of the first mixer is supplied to a local oscillator input of the first mixer, and a predetermined constant signal is supplied to a local oscillator input of the second mixer;
sequentially set a plurality of states of the variable load;
observe a variation between the direct current components detected by the detector for each one of the plurality of states of the variable load for the output signal of the first mixer; and
adjust at least one parameter of the first mixer influencing the direct current component of the output signal of the first mixer based on the observed variation.
2. The apparatus according to claim 1, wherein:
the direct current component of the output signal of the first mixer results from a mixing product of the local oscillator signal of the first mixer with a leakage signal component of the local oscillator signal of the first mixer, which appears at the input of the frequency converter and interacts with the variable load acting on the input of the frequency converter.

3. The apparatus according to claim 1, wherein:
the variable load configured to act on the input of the frequency converter comprises one or more of a short circuit switch of the input of the frequency converter, a switchable shunt resistor connected in parallel to the input of the frequency converter, a switchable capacitor connected in parallel to the input of the frequency converter, or a switch between the input of the frequency converter and at least one signal source of the input signal of the frequency converter.

4. The apparatus according to claim 1, wherein the controller is configured to:
disconnect the input signal from the input of the frequency converter;
execute at least one of setting the configuration of the frequency converter, observing the variation and adjusting the at least one parameter when the input signal is disconnected from the input of the frequency converter; and
reconnect the input signal to the input of the frequency converter.

5. The apparatus according to claim 1, wherein:
the first and second mixers are configured to operate with different phases,
the output of the frequency converter comprises one output for each mixer, and
the detector is configured to detect the direct current component of an output signal at each output of the frequency converter.

6. The apparatus according to claim 5, wherein the at least one parameter comprises one or more of:
a static direct current offset of the first mixer with absence of a local oscillator signal,
a static direct current offset of the first mixer with presence of a local oscillator signal, or
an imbalance at the first mixer.

7. The apparatus according to claim 5, wherein the controller is configured to set a configuration of the frequency converter in terms of a direct current value of a current source at any one of the outputs of the mixers or in terms of a value of at least one tunable part at any one of the outputs of the mixers.

8. The apparatus according to claim 1, wherein the apparatus is operable for a receiver of direct conversion type or a receiver of a mixer-first architecture.

9. A method for controlling an apparatus comprising a frequency converter configured to perform frequency conversion on an input signal, the frequency converter comprising a first mixer and a second mixer, a variable load configured to act on at least an input of the frequency converter, and a detector configured to detect a direct current component of an output signal of each of the first and second mixers, the method comprising:
setting a configuration of the frequency converter such that a local oscillator signal of the first mixer is supplied to a local oscillator input of the first mixer, and a predetermined constant signal is supplied to a local oscillator input of the second mixer;
sequentially setting a plurality of states of the variable load;
observing a variation between the direct current components detected by the detector for each one of the plurality of states of the variable load for the output signal of the first mixer; and
adjusting at least one parameter of the first mixer influencing the direct current component of the output signal of the first mixer based on the observed variation.

10. The method according to claim 9, wherein:
the direct current component of the output signal of the first mixer results from a mixing product of the local oscillator signal of the first mixer with a leakage signal component of the local oscillator signal of the first mixer, which appears at the input of the frequency converter and interacts with the variable load acting on the input of the frequency converter.

11. The method according to claim 9, wherein:
the variable load configured to act on the input of the frequency converter comprises one or more of a short circuit switch of the input of the frequency converter, a switchable shunt resistor connected in parallel to the input of the frequency converter, a switchable capacitor connected in parallel to the input of the frequency converter, or a switch between the input of the frequency converter and at least one signal source of the input signal of the frequency converter.

12. The method according to claim 9, further comprising:
disconnecting the input signal from the input of the frequency converter;
executing at least one of setting the configuration of the frequency converter, observing the variation and adjusting the at least one parameter when the input signal is disconnected from the input of the frequency converter; and
reconnecting the input signal to the input of the frequency converter.

13. The method according to claim 9, wherein:
the first and second mixers are arranged to operate with different phases,
the output of the frequency converter comprises one output for each mixer, and
the direct current component of an output signal is detected at each output of the frequency converter.

14. The method according to claim 13, wherein the at last one parameter comprises one or more of:
a static direct current offset of the first mixer with absence of a local oscillator signal,
a static direct current offset of the first mixer with presence of a local oscillator signal, or
an imbalance at the first mixer.

15. The method according to claim 13, wherein the configuration of the frequency converter is set in terms of a direct current value of a current source at any one of the outputs of the mixers or in terms of a value of at least one tumble part at any one of the outputs of the mixers.

16. The method according to claim 9, wherein the apparatus is operable for a receiver of direct conversion type or a receiver of a mixer-first architecture.

17. An apparatus comprising:
a first mixer;
a second mixer;
a variable load configured to act on inputs of the first and second mixers;
circuitry configured to
control a local oscillator signal of the first mixer to be supplied to a local oscillator input of the first mixer;
control a predetermined constant signal to be supplied to a local oscillator input of the second mixer;
sequentially set a plurality of states of the variable load;
observe a variation between direct current components for the output signal of the first mixer for each one of the plurality of states of the variable load; and adjust at least one parameter of the first mixer influencing the direct current component of the output signal of the first mixer based on the observed variation.

18. The apparatus of claim 17, wherein
the first mixer is an in-phase mixer, and
the second mixer is a quadrature mixer.

19. The apparatus of claim 17, wherein
the first mixer is a quadrature mixer, and
the second mixer is an in-phase mixer.

20. The apparatus of claim 17, wherein
the apparatus is a mobile terminal configured to communicate via a mobile network.

\* \* \* \* \*